United States Patent [19]

Bendler

[11] 4,209,774
[45] Jun. 24, 1980

[54] APPARATUS FOR CONVERTING A DC OR ANALOG SIGNAL TO A DIGITAL SIGNAL WITH MINIMUM DRIFT

[75] Inventor: Robert K. Bendler, Mountain View, Calif.

[73] Assignee: Acurex Corporation, Mountain View, Calif.

[21] Appl. No.: 884,210

[22] Filed: Mar. 7, 1978

Related U.S. Application Data

[63] Continuation of Ser. No. 708,072, Jul. 23, 1976, abandoned.

[51] Int. Cl.² ............................................. H03K 13/02
[52] U.S. Cl. ....................... 340/347 CC; 340/347 AD; 73/362 AR
[58] Field of Search .................. 340/347 CC, 347 AD; 73/362 AR

[56] References Cited

U.S. PATENT DOCUMENTS

| | | | |
|---|---|---|---|
| 3,027,079 | 3/1962 | Fletcher | 340/347 CC |
| 3,145,376 | 8/1964 | Currie | 340/347 CC |
| 3,877,307 | 4/1975 | Georgi | 73/362 AR |

OTHER PUBLICATIONS

Hnatek, "A User's Handbook of D/A and A/D Converters", Jun. 1976, p. 299.

Primary Examiner—Charles D. Miller
Attorney, Agent, or Firm—Flehr, Hohbach, Test, Albritton & Herbert

[57] ABSTRACT

Apparatus for converting a dc or analog signal from, for example, a resistance type temperature detector, includes an analog to digital converter which has zero temperature drift. This is achieved by the use of two identical successive approximation digital to analog converters with an external comparator connected to both converters at the same time. By switching, one converter is used to provide zero compensation the other converter being inactive except for utilizing it as the path for the amplifier drift current; then with the switch in its other phase the other converter is activated to convert the analog signal to digital format taking into account the previously computed drift signal.

2 Claims, 7 Drawing Figures

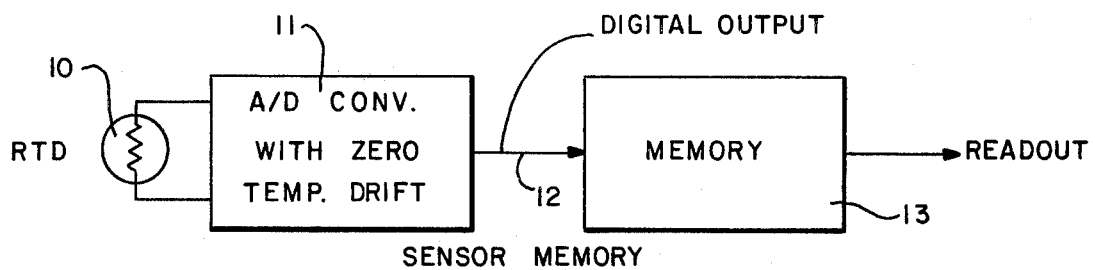
FIG.—1
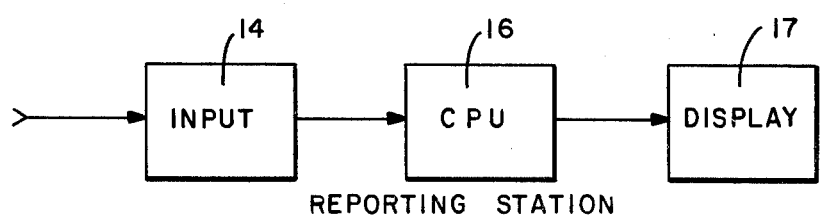
FIG.—2
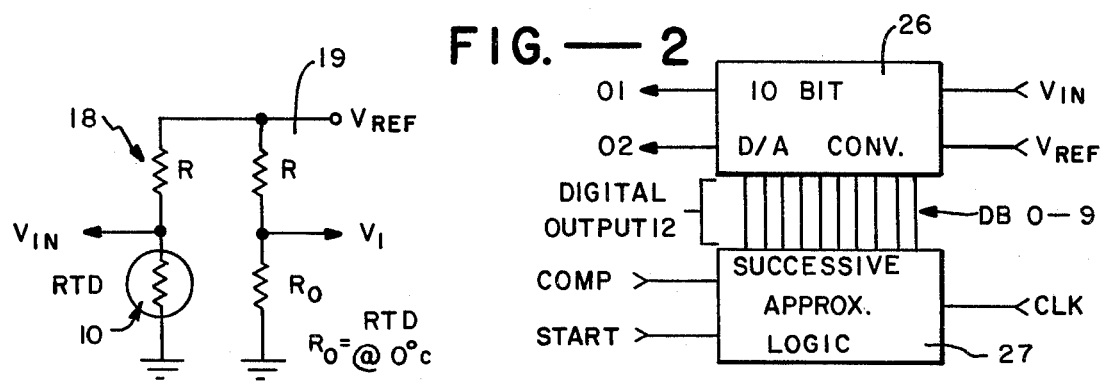
FIG—3
FIG.—5
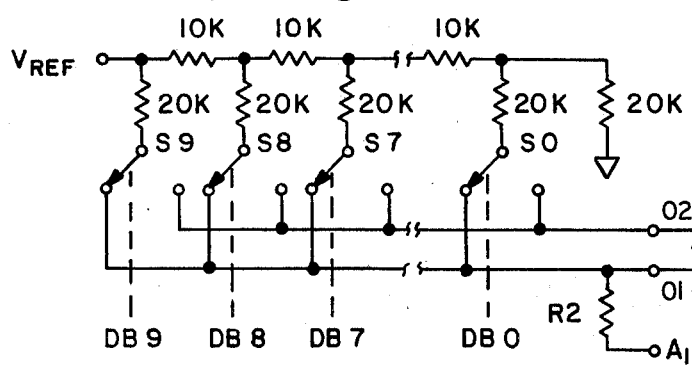
FIG.—6
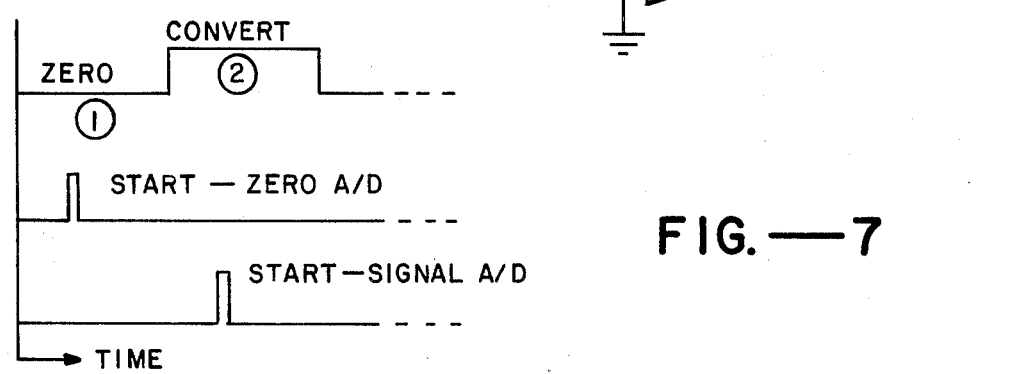
FIG.—7

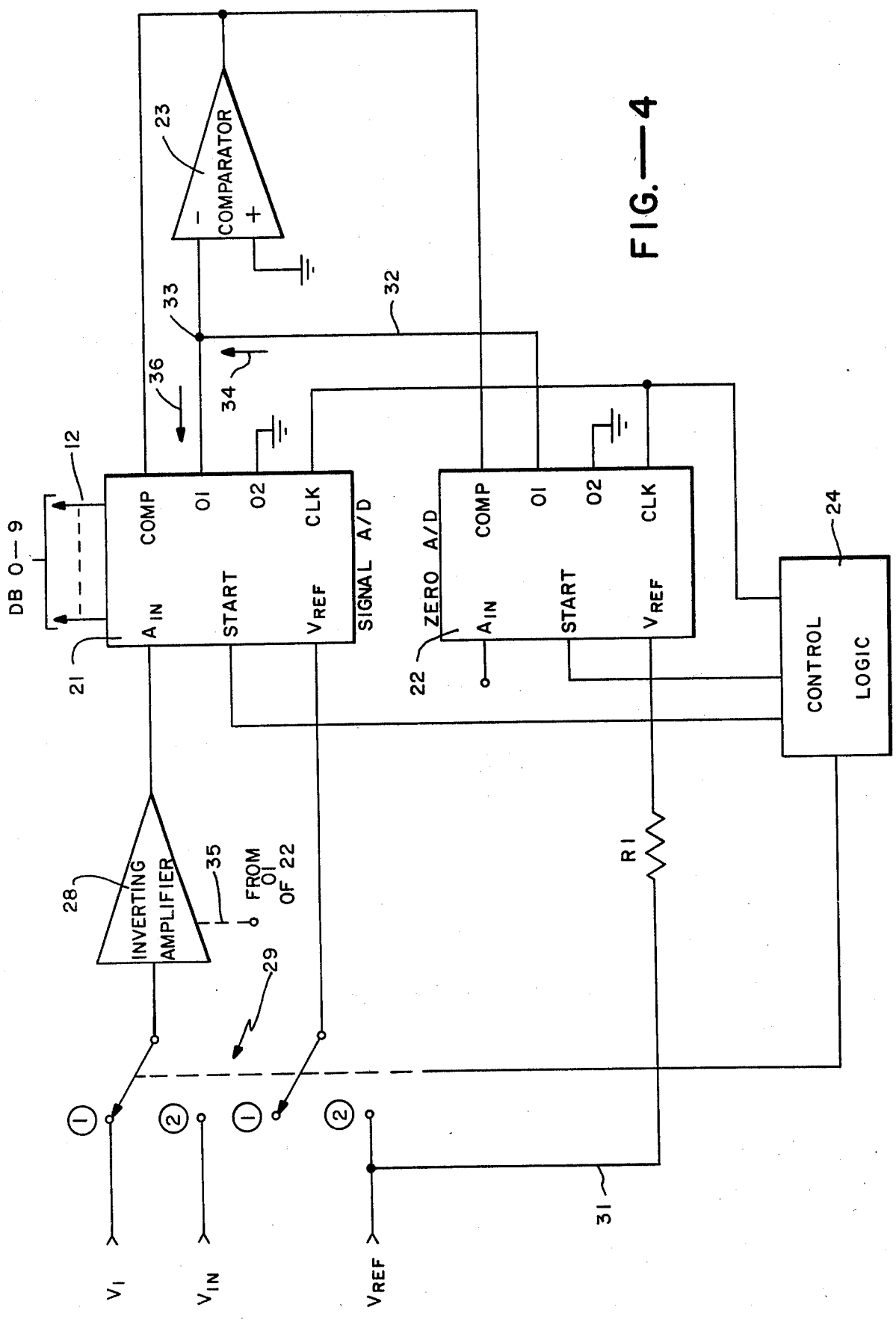
FIG.—4

4,209,774

APPARATUS FOR CONVERTING A DC OR ANALOG SIGNAL TO A DIGITAL SIGNAL WITH MINIMUM DRIFT

This is a continuation of application Ser. No. 708,072 filed July 23, 1976, now abandoned.

BACKGROUND OF THE INVENTION

The present invention is directed to apparatus for converting a dc or analog signal to a digital signal with minimum drift and more specifically, where the analog signal is produced by a resistance temperature detector element.

In the processing of, for example, food or drugs it is desirable to record processing temperature to insure that adequately high temperatures have been used. A typical temperature sensor is a resistance temperature detector (RTD). This produces a dc or analog signal which must be amplified and processed. Amplification of dc signals, of course, has the inherent problem of dc drift. This problem has been met by chopper stabilization or by use of a storage capacitor to provide an indication of drift and attendant correction. Both of the foregoing solutions do not work successfully under high ambient temperatures or require trimming of circuit components to minimize drift error. Other types of processing circuits are of an excessively large size with poor accuracy.

OBJECTS AND SUMMARY OF THE INVENTION

It is, therefore, an object of the present invention to provide an improved apparatus for converting a dc or analog signal to a digital signal with minimum drift.

It is another object of the invention to provide apparatus as above which is totally automatic in operation requiring no trimming.

It is another object of the invention to provide apparatus as above which provides good accuracy under severe ambient temperature conditions.

In accordance with the above objects apparatus is provided for sensing a dc signal, $V_{in}$, and converting it to a digital signal while minimizing the effects of drift. DC inverting amplifier means receive and amplify the dc signal. Signal generating means simulate a signal, $V_1$ corresponding to the zero value of the dc signal. A pair of successive approximation type analog to digital (A/D) converters are provided with a comparator. Each of the A/D converters has a digital to analog (D/A) converter output connected together and to a common input of the comparator. The output of the comparator is connected to the comparator inputs of each A/D converter. Each of the A/D converters have an analog voltage input, $A_{in}$, start inputs and reference voltage inputs, $V_{REF}$. The dc inverting amplifier means has its output connected to the $A_{in}$ of one of the A/D converters which provides the digital signals. Means are provided for permanently connecting the $V_{REF}$ input of the other A/D converter to $V_{REF}$. Switching and control logic means have two phases of operation and in the first phase connect $V_1$ to the input of the inverting amplifier and activate the start input of the other A/D converter. The second phase disconnects $V_1$ and connects $V_{in}$ to the input of the inverting amplifier and connects $V_{REF}$ to the $V_{REF}$ input of the one A/D converter and activates the start input of the one A/D converter to provide the digital signal.

BRIEF DESCRIPTION OF THE DRAWINGS

FIG. 1 is a block diagram of a sensor memory incorporating the present invention;

FIG. 2 is a block diagram of a reporting station used in conjunction with the present invention;

FIG. 3 is a circuit schematic of a bridge network used in the present invention;

FIG. 4 is a more detailed block circuit diagram of a portion of FIG. 1;

FIG. 5 is a more detailed block diagram of portions of FIG. 4;

FIG. 6 is a circuit schematic of portions of FIG. 4; and

FIG. 7 is a timing diagram useful in understanding the operation of the invention.

DETAILED DESCRIPTION OF THE PREFERRED EMBODIMENT

FIG. 1 illustrates the sensor memory unit which by means of a resistance temperature detector (RTD) 10 senses the ambient temperature in, for example, a food processing or drug processing environment. The change in resistance of RTD 10 is sensed by the analog to digital converter (A/D) 11 which, as will be discussed later, has zero temperature drift. Converter 11 produces a digital output on line 12 representative of the temperature sensed by RTD 10 which is stored in memory 13 for subsequent readout.

FIG. 2 is a reporting station to which the sensor memory of FIG. 1 is physically attached after the temperature has been sensed. The readout of FIG. 1 is attached to the input unit 14 which processes the digital information in central processing unit 16 for either display or printout at 17.

FIG. 3 illustrates the specific technique of sensing the change of resistance of RTD 10 and includes a common voltage supply $V_{REF}$ which is across the resistor legs 18 and 19. Resistor leg 18 consists of RTD 10 in series with a resistor R. The dc or analog voltage, $V_{in}$, is taken off on a voltage tap between R and RTD 10 to thereby sense any change in the resistance of RTD 10. In other words, $V_{in}$ is the dc or analog signal voltage which is representative of the temperature being measured. The other leg 19 includes an identical resistor R of the same value as the R in leg 18 in series with a resistor $R_o$ having a resistive value which corresponds to the zero value of RTD 10. In other words, $R_o$ is equal to RTD at 0° C. The voltage tap $V_1$ between R and $R_o$, thus provides a zero value voltage which will serve as a reference for drift correction to be described later.

In the present embodiment, a typical value of $V_1$ might be the product of a resistive value, $R_o$, of 100 ohms with a current of 1 milliampere being produced by $V_{REF}$ which would be 100 millivolts. If the temperature sensing element instead of a temperature variable resistor was a thermocouple with 0° ice point, then $V_1$ would be 0 volts.

The bridge network of FIG. 3 is ratiometric in construction and operation meaning that any change in temperature which causes a change in the resistor R in leg 18 will cause a similar change in the R in leg 19 tracking any possible error. In addition, the use of $V_{REF}$, which is also used in conjunction with other portions of the circuit to be described, also promotes the ratiometric compensation. However, it may be possible to use independent excitation voltage other than $V_{REF}$ and still maintain reasonable accuracy.

FIG. 4 illustrates the overall circuit of the present invention and has the three inputs $V_1$, $V_{in}$ and $V_{REF}$ which have previously been described. A pair of successive approximation type analog to digital (A/D) converters 21 and 22 are illustrated in block form with converter 21 processing the actual analog signal $V_{in}$ thus being designated a "signal A/D" with digital output 12 (see FIG. 1) and converter 22 being used for zero temperature drift correction and being designated "zero A/D." Each A/D converter is identical to each other and are integrated circuits available from, for example, Analog Devices of Norwood, Mass. under the designation AD7570. They are the type of A/D converter which requires an external comparator 23 where the output of the comparator is connected to the COMP inputs of each device 21, 22. Each A/D converter has $A_{in}$ and $V_{REF}$ voltage inputs and also start inputs which cause them to make their calculation or approximation. Start inputs along with the clock inputs are driven by a control logic unit 24. As illustrated in FIG. 5, a successive approximation A/D converter uses a digital to analog converter 26, successive approximation logic 27, comparator 23 and a voltage $V_{REF}$. In the preferred embodiment 10 bit A/D converters 21, 22 are utilized.

Finally, the outputs O1 and O2 are analog outputs from a resistive ladder network which is a portion of the digital to analog converter 26 of FIG. 5. Referring specifically to FIG. 6, the resistive ladder network is driven by $V_{REF}$ through 10K series resistors and 20K parallel resistors which are switched by switches designated S0 through S9 the switches being driven by the digital bits DB0 through DB9 between the output lines O1 and O2. O2 is grounded and O1 is also connected to $A_{in}$ through a 10K resistor, R2.

In general, the operation of a successive approximation A/D converter is as follows. A start pulse from the control logic 24 begins the conversion which is timed by a clock signal from the control logic. Successive approximation logic unit 27 (FIG. 5) sends digital numbers to the D/A converter 26 which in turn outputs a voltage or current proportional to the reference voltage and the digital number. The comparator 23 compares this voltage or current to the input voltage $A_{in}$ across the 10K resistor R2 of the ladder network illustrated in FIG. 6. The successive approximation logic unit 27 by examining the state of the comparator and changing successively less significant bits, eventually presents a digital number to the D/A converter 26 which results in a voltage or current at the comparator input (O1) within one least significant bit of zero. This digital number represents the value of the input signal $A_{in}$.

Although in the context of the present invention comparator 23 has been shown as physically external, this is merely due to the present state of the art of the production of integrated circuits. A suitable monolithic integrated circuit chip could be used incorporating a comparator as long as the input and output terminals were available for the connection to produce a circuit equivalent to that of FIG. 4. Also it would be necessary to disable one of the comparators unless the comparator drift and offset error were less than one least significant bit over the entire temperature range. In such case the circuit connection would merely tie the O1 outputs (or their equivalent) together.

The inverting amplifier 28 illustrated in FIG. 4 would normally be required to amplify the $V_{in}$ signal for use by the converter 21. However, normally in prior art techniques, zero drifts due to temperature in the amplifier cannot be distinguished from actual signals and thus would appear as error in the digital output 12. As will be discussed below, the present invention adds the second converter 22 which is used to cancel this zero drift.

More specifically, amplifier 28 is an inverting amplifier with its output connected to $A_{in}$ of converter 21. In the present invention the signal at $A_{in}$ must be unipolar and therefore amplifier 28 is biased (not shown) so that it cannot drift positive. Its input is connected to a switch 29 having the two positions indicated by the circled 1 and circled 2. In the circled 1 position the amplifier input is connected to $V_1$ and in the circled 2 position to $V_{in}$. These two positions represent the first and second phase of operation the first phase being the zero drift compensation phase and the second the actual signal measurement phase. In addition, in the phase 1 of switch 29 the $V_{REF}$ input of converter 21 is left floating and in the phase 2 position it is connected to the $V_{REF}$ voltage source. In any case, the $V_{REF}$ voltage source is permanently coupled through a line 31 and resistor $R_1$ to the $V_{REF}$ input of zero A/D converter 22. At the output side of the converters 21 and 22, the O1 outputs are connected together and form the common input to comparator 23. The output of the comparator is in turn connected to the comparator inputs of each A/D converter 21, 22. Control logic unit 24 controls the two phases of operation of the present invention by controlling the operation of switch 29 and the start inputs of the converters. This is illustrated in FIG. 7 where in the zero phase 1 the start pulse is given the zero A/D converter and in the convert phase 2 the start pulse is given the signal A/D converter.

In operation in the zero phase switch 29 is in position 1. The amplifier 28 is connected to voltage $V_1$ which, of course, represents the zero signal value of $V_{in}$. The $V_{REF}$ terminal of the signal A/D is left open which has the effect of disconnecting the D/A converter portion 26 (see FIG. 5) in the signal A/D. The zero A/D performs a conversion while the signal A/D remains idle. The resulting output on the O1 output line 32 from the zero A/D represents the zero drift due to the amplifier 28 and any other error causing drifts. The relative direction of the current to the node 33 is indicated by the arrow 34. This current produced by the zero A/D converter is equal and opposite to the current indicated by the arrow 36 flowing out of node 33 into the O1 input of the signal A/D. The voltage at the comparator input is within one least significant bit of zero. The current flows from the O1 input through a 10K resistor, R2, as illustrated in FIG. 6 through the $A_{in}$ input and through inverting amplifier 28 to $V_1$. As discussed previously, the digital to analog converter portion of the signal A/D is inoperative since the $V_{REF}$ is floating. Thus, there is in essence merely a resistive connection, $R_2$ between $A_{in}$ and O1.

In the zero compensation phase 1 the actual digital output of the zero A/D converter is ignored. Thus, the insertion of $R_1$ and its value can be arbitrary in this respect. However, the value of $R_1$ is substantially greater than the values of the resistor ladder network (FIG. 5) which are of the order of 10 to 20K ohms. Thus, $R_1$ might be, for example, 30K ohms. This is done to prevent any ambiguity in the least significant bit of the zero compensation procedure.

Next, in the second phase of operation of the conversion cycle where the signal $V_{in}$ is actually converted, switch 29 is in its position 2 thus connecting $V_{in}$ to inverting amplifier 28. The control logic 24 activates the start input of unit 21 to cause it to convert $V_{in}$ to a digital output on output 12. In addition, $V_{REF}$ is connected to the $V_{REF}$ input of the signal A/D. The signal A/D performs a conversion while the zero A/D holds its previous value. Thus, the signal A/D is actually converting the input signal at $A_{in}$ minus the O1 output of the zero A/D. Since this output is the zero drift, the digital conversion results in the true value of the input, free of drift effects.

An alternative circuit connection of FIG. 4 is made feasible by the fact that $A_{in}$ and O1 of the signal A/D are tied together by a resistor R2. Namely, the O1 output of the zero A/D can be alternatively connected to inverting amplifier 28 as shown by dashed line 35 which would be a noninverting input.

Thus, the present invention has provided an improved device for sensing a dc signal and converting it to a digital signal while minimizing the effects of temperature drift. This is done without the use of dc choppers or expensive and time consuming trimming. Moreover, since the converter units 21 and 22 are relatively small integrated circuits, very compact apparatus is possible.

What is claimed is:

1. Apparatus for sensing a dc signal, $V_{in}$, from a signal source which is a resistance temperature detector (RTD) having a predetermined zero temperature value and converting it to a digital signal while minimizing the effects of drift comprising: dc amplifier means susceptible to drift for receiving and amplifying said dc signal, $V_{in}$; signal generating means for simulating a signal, $V_1$, corresponding to said zero value of said dc signal; a pair of successive approximation type analog to dibital (A/D) converters including a comparator, each of said A/D converters having a digital to analog (D/A) converter output connected together and to a common input of said comparator, the output of said comparator being connected to the comparator inputs of each A/D converter, each of said A/D converters also having analog voltage inputs $A_{in}$, start inputs and reference voltage inputs, $V_{REF}$, said dc amplifier means having its output connected to the $A_{in}$ of one of said A/D converters which provides said digital signals; means for permanently connecting the $V_{REF}$ input of said other A/D converter to $V_{REF}$; switching and control logic means having two phases of operation and in its first phase connecting $V_1$ to the input of said amplifier means and activating the start input of said other A/D converter and in its second phase disconnecting $V_1$ and connecting $V_{REF}$ to said $V_{REF}$ input of said one A/D converter and activating the start input of said one A/D converter to provide said digital signal; said signal generating means including a bridge network having a common voltage supply across two legs, one leg comprising said RTD in series with a resistor having a value R, said other leg comprising a resistor having a value R in series with a resistor $R_o$ having a resistive value which corresponds to the zero value of said RTD, the voltage $V_1$ being taken off the other leg between the two series resistors and $V_{in}$ being taken off between the series resistors of said one leg.

2. Apparatus as in claim 1 where said common voltage supply is $V_{REF}$.

* * * * *